United States Patent
Zhang et al.

(10) Patent No.: US 9,607,123 B2
(45) Date of Patent: Mar. 28, 2017

(54) METHOD FOR PERFORMING DEEP N-TYPED WELL-CORRELATED (DNW-CORRELATED) ANTENNA RULE CHECK OF INTEGRATED CIRCUIT AND SEMICONDUCTOR STRUCTURE COMPLYING WITH DNW-CORRELATED ANTENNA RULE

(71) Applicant: UNITED MICROELECTRONICS CORP., Hsin-Chu (TW)

(72) Inventors: Xing Hua Zhang, Singapore (SG); Chi-Fa Ku, Kaohsiung (TW); Hong Liao, Singapore (SG); Ye Chao Li, Singapore (SG); Hui Yang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 113 days.

(21) Appl. No.: 14/598,236

(22) Filed: Jan. 16, 2015

(65) Prior Publication Data
US 2016/0211187 A1   Jul. 21, 2016

(51) Int. Cl.
| | |
|---|---|
| *G06F 17/50* | (2006.01) |
| *H01L 23/58* | (2006.01) |
| *H01L 21/66* | (2006.01) |
| *H01L 23/528* | (2006.01) |
| *H01L 21/8238* | (2006.01) |
| *H01L 27/02* | (2006.01) |
| *H01L 23/10* | (2006.01) |
| *H01L 27/06* | (2006.01) |
| *H01L 23/00* | (2006.01) |

(52) U.S. Cl.
CPC .......... *G06F 17/5081* (2013.01); *H01L 22/34* (2013.01); *H01L 23/58* (2013.01); *H01L 21/823871* (2013.01); *H01L 23/10* (2013.01); *H01L 23/528* (2013.01); *H01L 23/562* (2013.01); *H01L 27/0266* (2013.01); *H01L 27/0629* (2013.01); *H01L 2924/0002* (2013.01)

(58) Field of Classification Search
CPC ......... G06F 17/5081; H01L 21/823871; H01L 27/0266; H01L 27/0629; H01L 22/30; H01L 23/528
See application file for complete search history.

(56) References Cited

U.S. PATENT DOCUMENTS

| | | | |
|---|---|---|---|
| 5,959,311 A * | 9/1999 | Shih | H01L 22/34 257/355 |
| 6,060,347 A | 5/2000 | Wang | |
| 6,194,233 B1 * | 2/2001 | Bedner | H01L 21/76838 257/E21.582 |
| 6,365,939 B1 * | 4/2002 | Noguchi | H01L 23/60 257/355 |
| 6,594,809 B2 * | 7/2003 | Wang | H01L 27/0629 257/E27.016 |

(Continued)

*Primary Examiner* — Helen Rossoshek
(74) *Attorney, Agent, or Firm* — Winston Hsu; Scott Margo

(57) ABSTRACT

A semiconductor monitoring device includes a substrate, a die seal ring formed on the substrate, a deep n-typed well formed in the substrate under the die seal ring, and a monitoring device electrically connected to the die seal ring. The monitoring device is formed in a scribe line region defined on the substrate. A width of the deep n-typed well is larger than a width of the die seal ring.

10 Claims, 8 Drawing Sheets

(56) References Cited

U.S. PATENT DOCUMENTS

| | | | | |
|---|---|---|---|---|
| 6,651,236 B2* | 11/2003 | Ichimiya | H01L 27/118 | 257/203 |
| 6,792,578 B1* | 9/2004 | Brown | H01L 24/02 | 257/355 |
| 6,862,723 B1 | 3/2005 | Wang et al. | | |
| 7,174,527 B2* | 2/2007 | Itou | H01L 22/14 | 257/E21.531 |
| 7,240,312 B2* | 7/2007 | Dang | G06F 17/5081 | 716/112 |
| 7,317,633 B2* | 1/2008 | Lusky | H01L 27/11568 | 257/324 |
| 7,523,419 B2* | 4/2009 | Furuki | G06F 17/5077 | 716/118 |
| 7,721,244 B2* | 5/2010 | Ono | G06F 17/5077 | 703/14 |
| 7,737,472 B2* | 6/2010 | Kondo | H01L 27/11807 | 257/204 |
| 7,902,600 B2* | 3/2011 | Lin | H01L 21/761 | 257/288 |
| 8,148,797 B2* | 4/2012 | Weng | H01L 21/76838 | 257/503 |
| 8,341,560 B2* | 12/2012 | Kobayashi | G06F 17/5036 | 716/115 |
| 8,848,394 B2* | 9/2014 | Andrei | H03F 1/26 | 174/257 |
| 8,946,825 B2* | 2/2015 | Yen | H01L 21/82387 | 257/356 |
| 9,378,329 B1* | 6/2016 | Henderson | H01L 29/78 | |
| 2002/0083404 A1* | 6/2002 | Ishikura | G06F 17/5072 | 257/355 |
| 2002/0155680 A1* | 10/2002 | Chen | H01L 21/28123 | 438/454 |
| 2006/0097324 A1* | 5/2006 | Arai | H01L 27/0207 | 257/357 |
| 2006/0197149 A1* | 9/2006 | Fujimoto | H01L 21/823814 | 257/335 |
| 2006/0225007 A1* | 10/2006 | Wang | G06F 17/5036 | 716/112 |
| 2006/0270189 A1* | 11/2006 | Ogita | H01L 27/12 | 438/455 |
| 2007/0215860 A1* | 9/2007 | Komiyama | B82Y 10/00 | 257/21 |
| 2007/0262350 A1* | 11/2007 | Nagase | H01L 21/761 | 257/206 |
| 2008/0237661 A1* | 10/2008 | Ranade | H01L 21/26506 | 257/288 |
| 2009/0315119 A1* | 12/2009 | Stribley | H01L 27/092 | 257/369 |
| 2011/0204358 A1* | 8/2011 | Sakamoto | G06F 17/5063 | 257/48 |
| 2012/0126285 A1* | 5/2012 | Campi, Jr. | H01L 21/82389 | 257/173 |
| 2012/0256271 A1* | 10/2012 | Wei | H01L 27/0629 | 257/379 |
| 2013/0256801 A1* | 10/2013 | Yen | H01L 21/82387 | 257/357 |
| 2014/0173544 A1* | 6/2014 | Giraud | G06F 17/5068 | 716/119 |
| 2015/0318273 A1* | 11/2015 | Lue | H01L 27/0629 | 257/296 |

* cited by examiner

METHOD FOR PERFORMING DEEP N-TYPED WELL-CORRELATED (DNW-CORRELATED) ANTENNA RULE CHECK OF INTEGRATED CIRCUIT AND SEMICONDUCTOR STRUCTURE COMPLYING WITH DNW-CORRELATED ANTENNA RULE

BACKGROUND OF THE INVENTION

1. Field of the Invention

The invention relates to a monitoring semiconductor device, a method for performing a deep n-typed well-correlated (hereinafter abbreviated as DNW-correlated) antenna rule check of an integrated circuit, and a semiconductor structure complying with the DNW-correlated antenna rule.

2. Description of the Prior Art

With rapid advancement of semiconductor fabricating technology, the integration level of integrated circuits (ICs) is bound to increase continuously in order to improve the device speed and performance. And the continuing shrinkage of the device dimensions, which in order to comply with current requirements for light weight, slimness, and compactness, involves a plurality of issues associated therewith, such as a thinner gate dielectric layer is required.

It therefore results another issue due to the thinner gate dielectric layer: The thinner gate dielectric layer, which overlies the channel region, is fragile and highly susceptible to damages from external sources during manufacturing processes. Should any damages caused to the gate dielectric layer, gate leakage current is inevitably increased, and it even causes device failure. In recent year, such damages to the gate dielectric layers are particularly found in the devices electrically connected to the deep n-typed well (hereinafter abbreviated as DNW), which is usually provided to prevent noise. Please refer to FIG. 1, which is a line graph illustrating a relationship between defected device ratio and DNW area ratio on a chip. In FIG. 1, the abscissa indicates the DNW area ratio on a chip, and the ordinate indicates the defected device ratio. As shown in FIG. 1, it is found that there is a linear relationship between the DNW area ratio and the defected device ratio. Consequently, it is concluded that such damage is getting worse when the DNW area ratio is increased.

Therefore, a device that is able to efficaciously monitor the abovementioned DNW-correlated defects is in need. Furthermore, a new rule, that is able to prevent the DNW-correlated defects, for the layout designer is also in need.

SUMMARY OF THE INVENTION

According to the claimed invention, a semiconductor monitoring device is provided. The semiconductor monitoring device include a substrate, a die seal ring formed on the substrate, a deep n-typed well formed in the substrate under the die seal ring, and a monitoring device electrically connected to the die seal ring.

According to the claimed invention, a method for performing a deep n-typed well correlated (DNW-correlated) antenna rule check of an integrated circuit is provided. The method includes the following steps. A design layout of the integrated circuit is provided. The design layout of the integrated circuit includes a deep n-typed well, at least a first device formed in the deep n-typed well, a plurality of first interconnections electrically connected to the first device, at least a second device, and a plurality of second interconnections electrically connected to the second device. The second device is electrically connected to the deep n-typed well. The design layout of the integrated circuit is then checked with the DNW-correlated antenna rule by a design rule check (hereinafter abbreviated as DRC) tool. The DNW-correlated antenna rule includes an inequality as following:

$$Ma/Ga < (P + 200*n)$$

In the inequality, Ma indicates a sum of areas of the first interconnections and areas of the second interconnections, Ga indicates a gate area of the second device, P indicates a first predetermined value, and n indicates a second predetermined value. The layout design of the integrated circuit is re-designed when the DNW-correlated antenna rule is violated.

According to the claimed invention, a semiconductor structure is provided. The semiconductor structure includes a substrate. The substrate includes a deep n-typed well and a p-typed well formed therein. The semiconductor structure also includes at least a first device formed in the deep n-typed well, a plurality of first interconnections formed on the substrate and electrically connected to the first device, at least a second device formed in the p-typed well, and a plurality of second interconnections formed on the substrate and electrically connected to the second device and to the first interconnections. Areas of the first interconnections, areas of the second interconnections and a gate area of the second device comply with a DNW-correlated antenna rule, and the DNW-correlated antenna rule includes an inequality as following:

$$Ma/Ga < (P + 200*n)$$

In the inequality, Ma indicates a sum of the areas of the first interconnections and the areas of the second interconnections, Ga indicates the gate area of the second device, P indicates a first predetermined value, and n indicates a second predetermined value.

According to the present invention, a semiconductor monitoring device is provided. By landing the die seal ring on a large-area DNW, the DNW-correlated antenna effect is amplified and thus is easily detected by the monitoring device, which is electrically connected to the die seal ring. According to the present invention, a method for performing a DNW-correlated antenna rule check of an integrated circuit is provided. The method includes an inequality that must be complied. When the inequality is violated, the design layout of the integrated circuit must be adjusted, corrected, and/or re-designed. That is, the method for performing the DNW-correlated antenna rule check of the integrated circuit of the present invention provides a practical inequality to guide the layout designer so that the DNW-correlated antenna effect can be efficaciously prevented. Accordingly, a semiconductor structure formed in accordance with the design layout is obtained, and the semiconductor device is protected from the DNW-correlated antenna effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
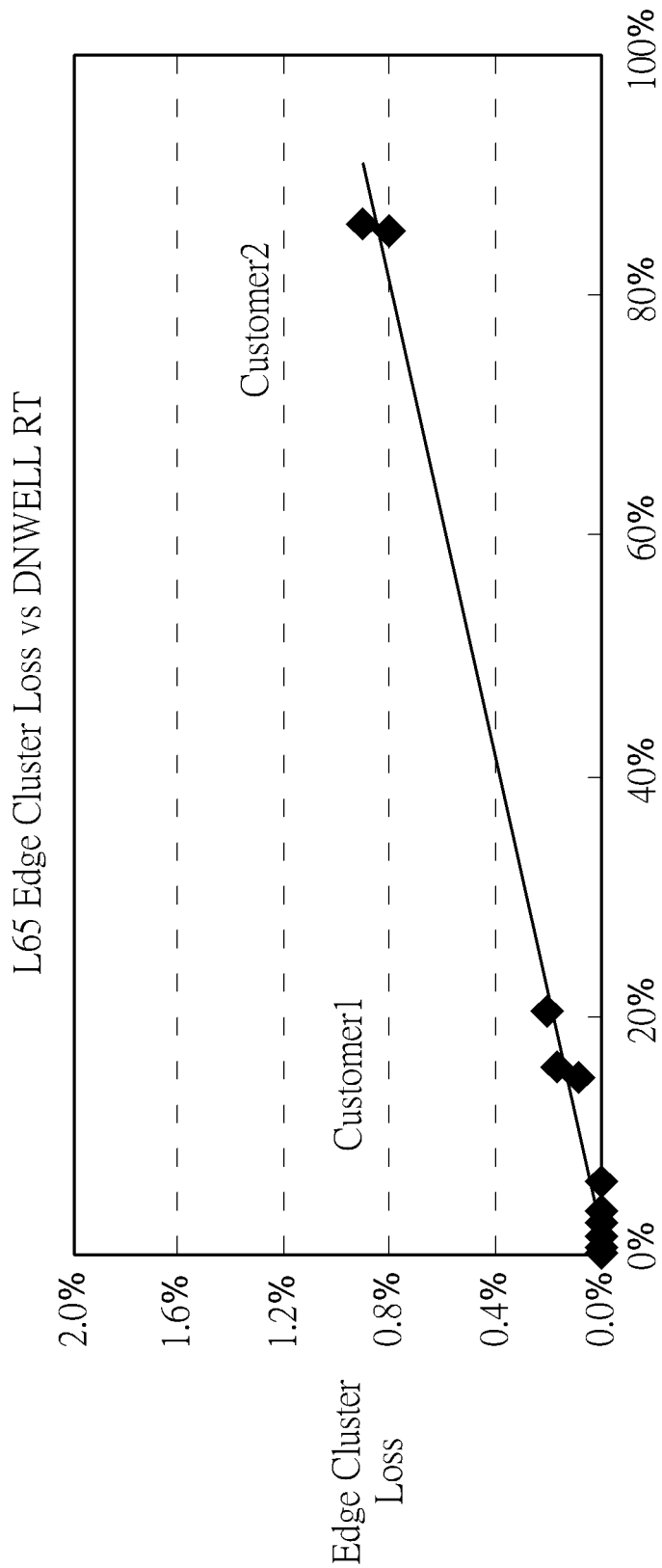
FIG. 1 is a line graph illustrating a relationship between defected device ratio and DNW area ratio on a chip.
Figure 2:
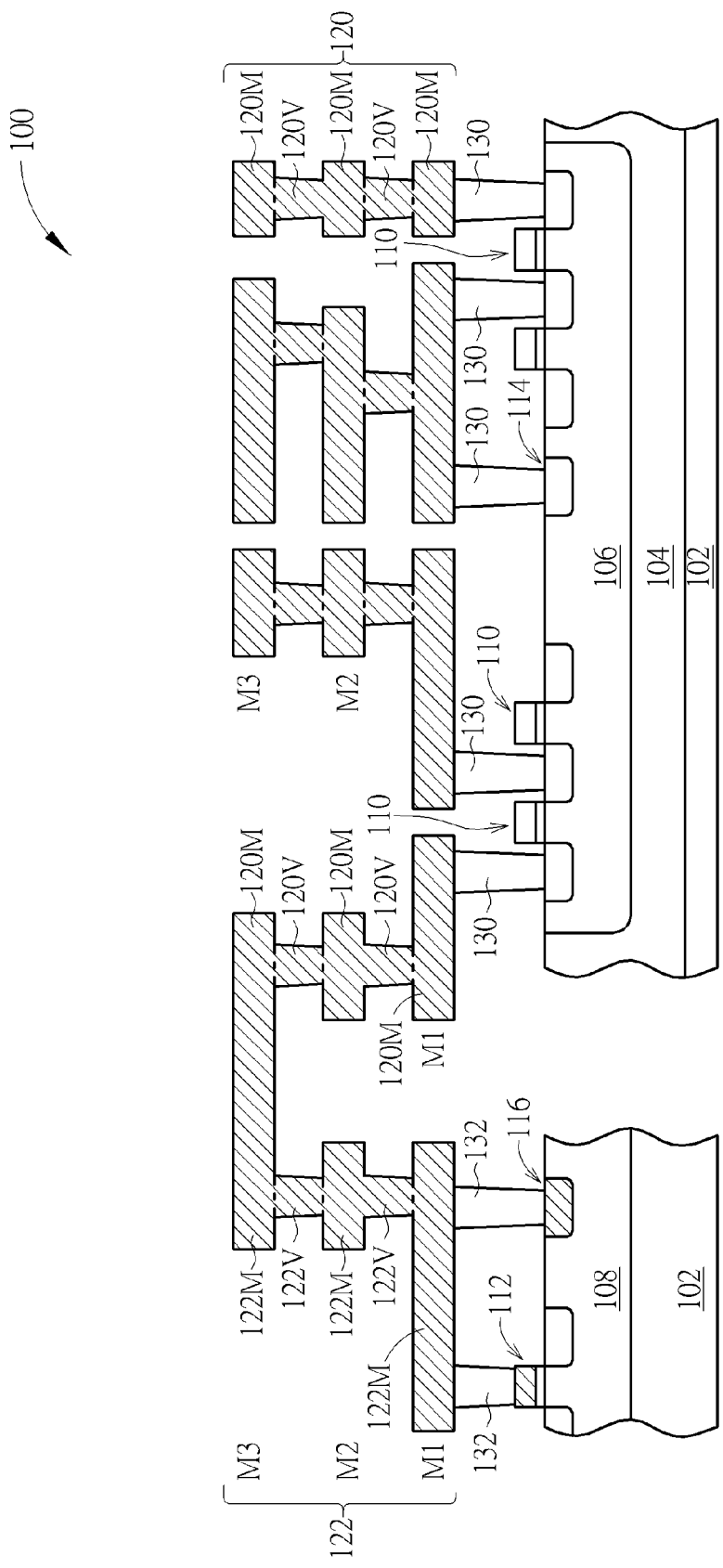
FIG. 2 is a schematic drawing illustrating a semiconductor structure.

Please refer to FIG. 2, which is a schematic drawing illustrating a semiconductor structure. The semiconductor structure 100 includes a p-typed substrate (hereinafter abbreviated as p-substrate) 102, and a first p-typed well 106 and a second p-typed well 108 are formed in the p-substrate 102. The first p-typed well 106 and the second p-typed well 108 are physically spaced apart from each other. It is noteworthy that a deep n-typed well (DNW) 104 is formed in the p-substrate 102 in order to prevent noise, and the first p-typed well 106 is formed in and encompassed by the DNW 104. A plurality of first devices 110 are formed in the first p-typed well 106 in the DNW 102 and at least a second device 112 is formed in the second p-typed well 108 in the p-substrate 102. The first devices 110 and the second device 112 respectively can be a metal-oxide-semiconductor field effect transistor (hereinafter abbreviated as MOSFET) device, and the MOSFET device includes a gate electrode, a source region and a drain region. Additionally, at least a diode 114 is optionally formed in the first p-typed well 106 and at least a diode 116 is optionally formed in the second p-typed well 108. The diode 114 is electrically connected to the first device 110 and the diode 116 is electrically connected to the second device 112. The semiconductor structure 100 further includes a plurality of first interconnections 120 electrically connected to the first devices 110 and a plurality of second interconnections 122 electrically connected to the second device 112. Additionally speaking, the second interconnections 122 are electrically connected to the gate electrode of the second MOSFET device 112. Furthermore, the first interconnections 120 are electrically connected to the DNW 104 as shown in FIG. 2. It should be noted that the interconnections stacked on and electrically connected to the DNW 104 are all recognized as the first interconnections 120. Those skilled in the art would easily realize that the first interconnections 120 are constructed by a plurality of metal layers 120M and a plurality of via plugs 120V, and the second interconnections 122 are constructed by a plurality of metal layers 122M and a plurality of via plugs 122V. Furthermore, the metal layers 120M/122M are formed in a plurality of dielectric layers (not shown) and are also recognized as M1, M2, M3 . . . , and so on. And the via plugs 120V/122V are formed to electrically connect the metal layers 120M/122M. Additionally speaking, a plurality of first contact plugs 130 are provided to electrically connect the first devices 110 to the first interconnections 120 and a plurality of second contact plugs 132 are provided to electrically connect the second device 112 to the second interconnections 122. In some application, the first interconnections 120 and the second interconnections 122 are electrically connected so that the second device 112 is therefore electrically connected to the DNW 104 as shown in FIG. 2.

It is known that electrical charges are always caused during the fabricating process. For example, reactive-ion etchings used in the back-end-of-line processing for building the metal layers 120M/122M and the via plugs 120V/122V usually generate a large number of charges. Ideally, those electrical charges are grounded and released by the diodes 114 and 116. However, it is found that the DNW 104 detains the electrical charges. More important, those accumulated charges are poured and injected into the second device 112 and the diode 116 once the electrical connection between the first interconnections 120 (electrically connected to the DNW 104) and the second interconnections (electrically connected to the second device 112) are constructed as shown in FIG. 2. Consequently, the diode 116 is not sufficient to release the large numbers of charges and those charges may be collected at the gate conductive layer, and thus potential for gate dielectric breakdown is increased. More severe, those charges may penetrate through the gate dielectric layer of the second device 112. As a result, the gate dielectric layer of the second device 112 is badly damaged and thus current leakage is increased. In the worse condition, the second device 112 fails due to the damages caused by the electrical charges. Since those damages happen to the second device 112 that is connected to the DNW 104, it is concluded that there is a DNW charging issue, also known as DNW-correlated antenna effect, in the manufacturing processes.

To prevent the DNW-correlated antenna effect, a DNW-correlated antenna rule is provided to guide the layout designer. It is well-known that a design of an integrated circuit is a complicated and time consuming process. Generally, a step called floor planning is first performed. The floor planning includes processes for identifying structure that should be placed close together, and allocating space for them in such manner as to meet certain criteria such as available space and required performance. A step of placement is next performed to put the various structures in appropriate locations of the floor plan. After placement of the standard cells, a routing step is performed in which electrical conductors are laid out on the chip in order to interconnect the electronic modules with each other and with peripheral contact pads that are used to connect the IC with external circuitry. Additionally, the detailed design layout requires a very intensive and time consuming effort, and is typically performed utilizing specialized computer aided design (CAD) or electronic design automation (EDA) tools. Following the placement and routing, a series design rule checks (DRCs) are performed to determine whether any of the known design rules is violated by the final placement and routing. Once the rule is violated, the design layout must be adjusted, corrected, or re-designed. Only when the DRCs are complied, the design layout is ready for fabrication and is sent to a fabrication facility. According to the present invention, the DNW-correlated antenna rule is provided to the layout designer so that the layouts for forming the semiconductor device 100 can be checked to prevent the DNW-correlated antenna effect before fabrication.

Figure 3:
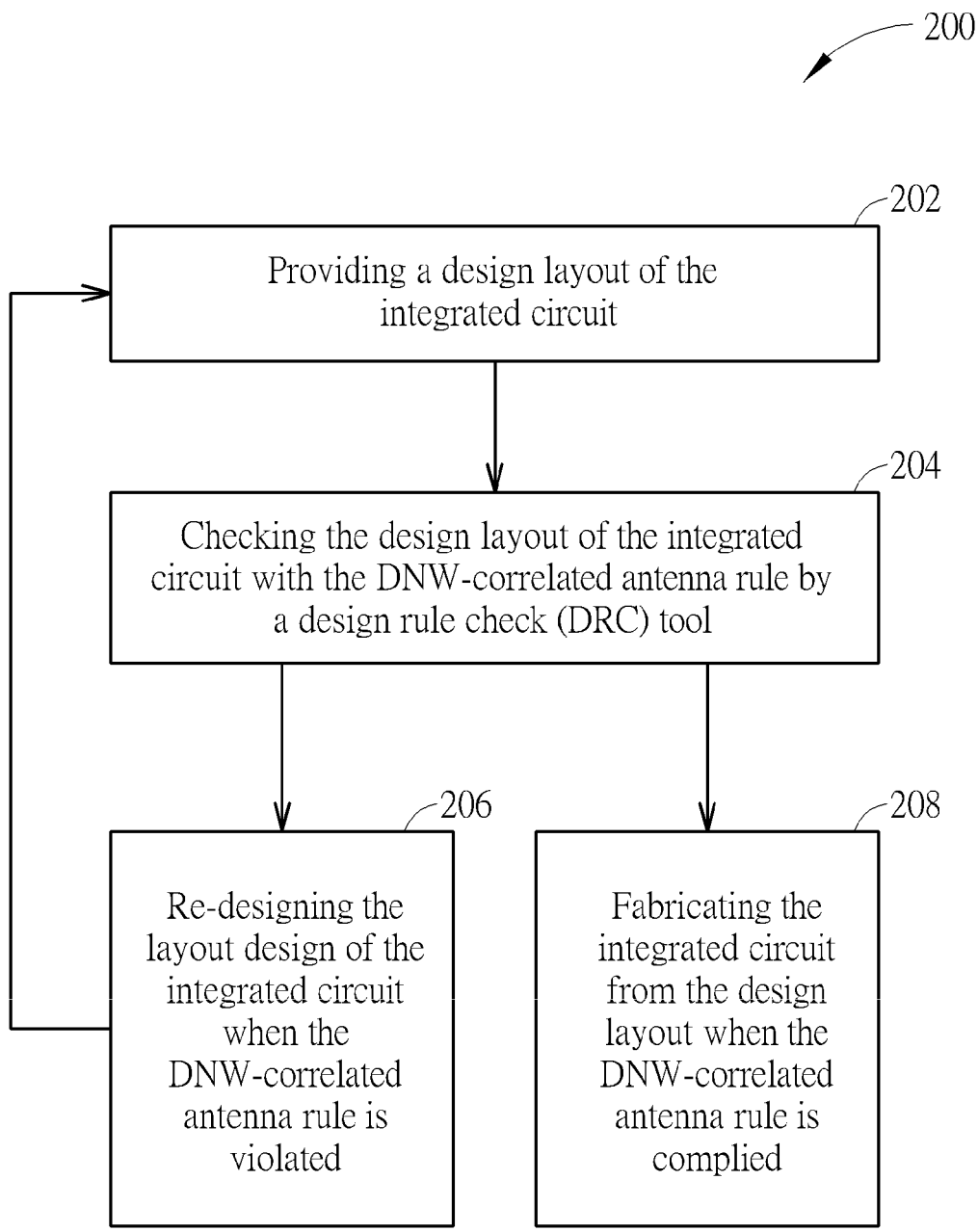
FIG. 3 is a flow chart illustrating a method for performing a DNW-correlated antenna rule check of an integrated circuit provided by a preferred embodiment of the present invention.

Please refer to FIG. 3, which is a flow chart illustrating a method for performing a DNW-correlated antenna rule check of an integrated circuit provided by a preferred embodiment of the present invention. As shown in FIG. 3, the method for performing the DNW-correlated antenna rule check of the integrated circuit 200 includes:

STEP 202: Providing a design layout of the integrated circuit

The integrated circuit includes a DNW, at least a first device formed in the DNW, a plurality of first interconnections electrically connected to the first device, at least a second device, and a plurality of second interconnections electrically connected to the second device. It is noteworthy that the second device is formed in a p-typed well, instead of the DNW. The first device and the second device respectively include a metal-oxide-semiconductor field effect transistor (hereinafter abbreviated as MOSFET) device. The MOSFET device includes a gate electrode, a source region and a drain region. The second interconnections are electrically connected to the gate electrode of the MOSFET device of the second device. More important, the first interconnections and the second interconnections are electrically connected. Therefore, the second device is electrically connected to the DNW through the second interconnections and the first interconnections. Furthermore, it is well-known to those skilled in the art that the integrated circuit includes at least a first contact plug electrically connecting the first device to the first interconnections and at least a second contact plug electrically connecting the second device to the second interconnections.

The provided design layout of the integrated circuit includes layout patterns for constructing the above mentioned wells, devices and interconnections. For example, a layout pattern of the design layout is a DNW layout pattern; another layout pattern of the design layout is a p-typed well layout pattern; another layout pattern of the design layout is a gate electrode layout pattern of the first device and the second device; another layout patterns of the design layout are source/drain patterns of the first and the second devices; another layout pattern of the design layout is a contact plugs layout pattern; another layout patterns of the design layout are metal layer patterns of the first and second interconnections; and still another layout patterns of the design layout are via plug patterns of the first and second interconnections. However, those skilled in the art would easily realize that the any layout patterns required for constructing the integrated circuit can be adopted. According to the preferred embodiment, the design layout including the abovementioned layout patterns is provided.

Figure 4:
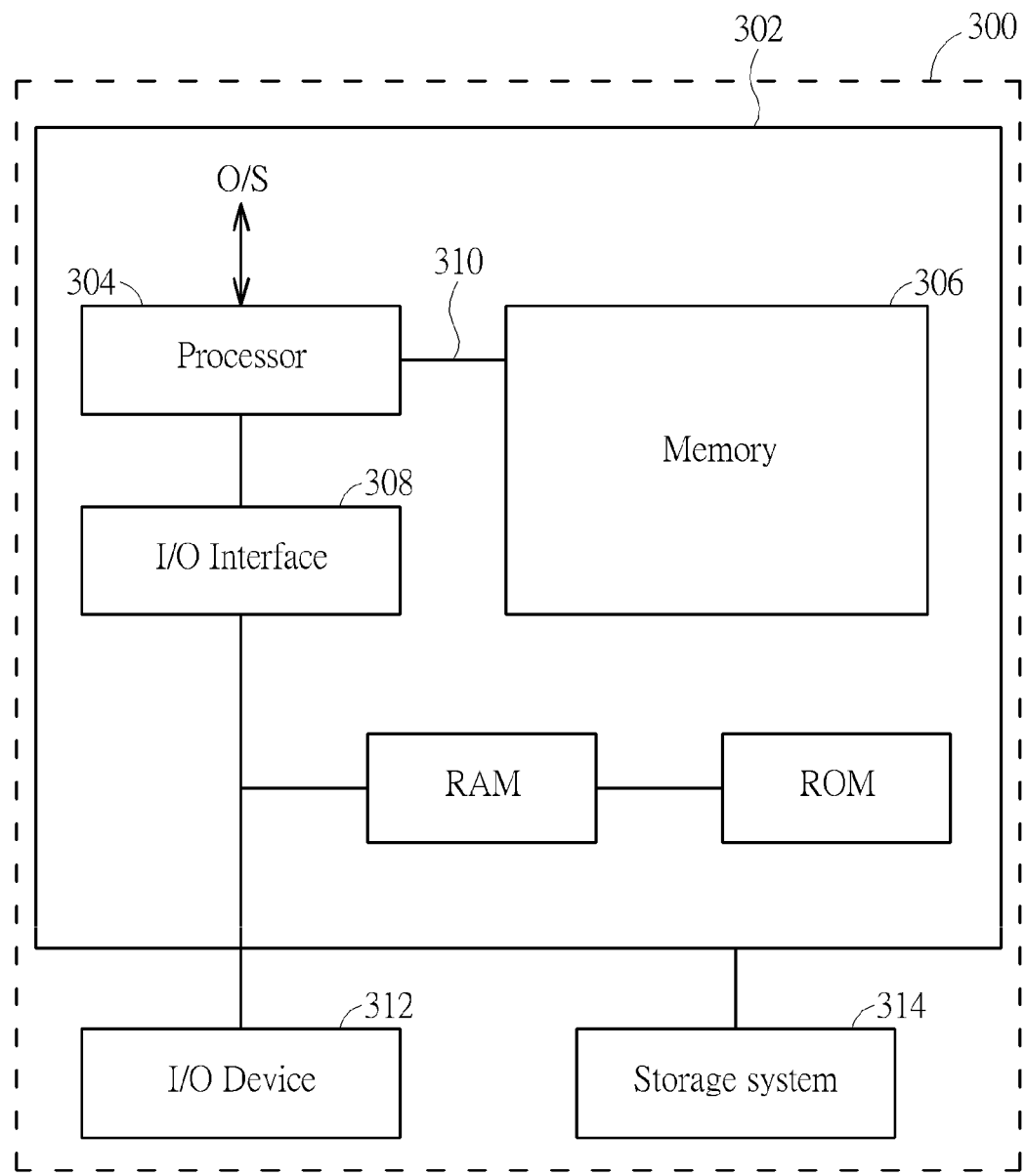
FIG. 4 is a block diagram of an illustrative computer system suitable for implementing the DNW-correlated antenna rule check.

Please refer to FIG. 3. The method for performing the DNW-correlated antenna rule check of the integrated circuit 200 includes:

STEP 204: checking the design layout of the integrated circuit with the DNW-correlated antenna rule by a design rule check tool According to the preferred embodiment, the provided design layout is checked with the DNW-correlated antenna rule by a DRC tool. The DRC tool for performing and implementing the DNW-correlated antenna rule check can be any well-known hardware or software, or any combined hardware and software. For example, a computer system is provided for implementing the DNW-correlated antenna rule check. Please refer to FIG. 4, which is a block diagram of an illustrative computer system suitable for implementing the DNW-correlated antenna rule check. As shown in FIG. 4, the DRC tool 300 includes a computing device 302. The computing device 302 can be resident on a network infrastructure or computing device of a third part service. The computing device 302 includes a processor 304, a memory 306, an input/output (I/O) interface 308, and a bus 310. The processor 304 executes computer program code which is stored in the memory 306 and a storage system 314, and the program code executes the step of checking the DNW-correlated antenna rule. The memory 306 includes local memory employed during actual execution of program code. The bus 310 provides a communications link between each of the components in the computing device 302. The computing device 302 additionally includes random access memory (RAM), a real-only memory (ROM), and an operating system (0/S). The computing device 302 is in communication with an external I/O device 312 and a storage system 314. The I/O device 312 can include any type of device that enables an individual to interact with the computing device 302, such as handheld device, handset, keyboard, etc. Additionally, the DRC tool 300 itself can be of varying types including a personal computer, a portable computer, a workstation, a computer terminal, a network computer or user device. The DRC tool 300 is exemplarily shown in FIG. 4, and those skilled in the art would easily realize that the DRC tool 300 can include other components or elements.

The DWN-correlated antenna rule includes an inequality as following:

$$Ma/Ga < (P+200*n)$$

In the inequality, Ma indicates a sum of areas of the first interconnections and areas of the second interconnections, Ga indicates a gate area of the second device, P indicates a first predetermined value, and n indicates a second predetermined value. It is noteworthy that "Ma" is obtained from the metal layer patterns and via plug patterns of design layout of the integrated circuit and "Ga" is obtained from gate electrode pattern of the second device of the design layout of the integrated circuit. Briefly speaking, the elements emphasized by slashes as shown in FIG. 2 are involved in the inequality. The first predetermined value "P" is related to the technology node, with which the device size are associated. For example, when the first device and the second device include a 65 nanometer (65 nm) device size, the first predetermined value "P" is equal to 800. When the first device and the second device include a 40 nm device size, the first predetermined value "P" is equal to 600. Therefore, the first predetermined value "P" can be acquired at the beginning of the check because the technology node has already been determined.

It is noteworthy that, a diode for releasing the accumulated charges may be formed and electrically connected to the second device, and electrically connected to the DWN. When the integrated circuit further includes at least one or more diode, the design layout further includes a diode layout pattern. The second predetermined value "n" is equal to an area of the diode(s), which is easily obtained from the diode layout pattern of the layout design. In another circumstance when there is no diode formed and electrically connected to the second device, in other words, there is only the second device being electrically connected to the deep n-typed well, the second predetermined value "n" is equal to 0.

Please refer to FIG. 3. The method for performing the DNW-correlated antenna rule check of the integrated circuit 200 includes:

STEP 206: Re-designing the layout design of the integrated circuit when the DNW-correlated antenna rule is violated STEP 208: Fabricating the integrated circuit from the design layout when the DNW-correlated antenna rule is complied According to STEP 206 of the method, when the DNW-correlated antenna rule is violated, that is, when the inequality is violated, the layout design is adjusted, corrected, and/or re-designed. The re-designed design layout is then provided to be checked again until the DNW-correlated antenna rule is complied.

On the other hand, when the DNW-correlated antenna rule is complied, the design layout of the integrated circuit is sent to a fabrication facility, and the integrated circuit is built up and fabricated from the design layout. And thus, a semiconductor structure 400 complying with the DNW-correlated antenna rule is constructed and provided. Accordingly, a DNW is formed according to a DNW layout pattern of the design layout, a plurality of p-doped/n-doped regions are formed according to doped region layout patterns of the design layout, and a plurality of p-gates/n-gates are formed according to the gate electrode layout pattern of the design layout. In the same concept, a plurality of contact plugs are formed according to the contact plug layout pattern of the design layout, and a plurality of first/second metal layers and a plurality of the first/second via plugs are formed according to the interconnection layout patterns of the design layout. Most important of all, the design layout, which includes the abovementioned patterns, complies with the DNW-correlated antenna rule.

Figure 5:
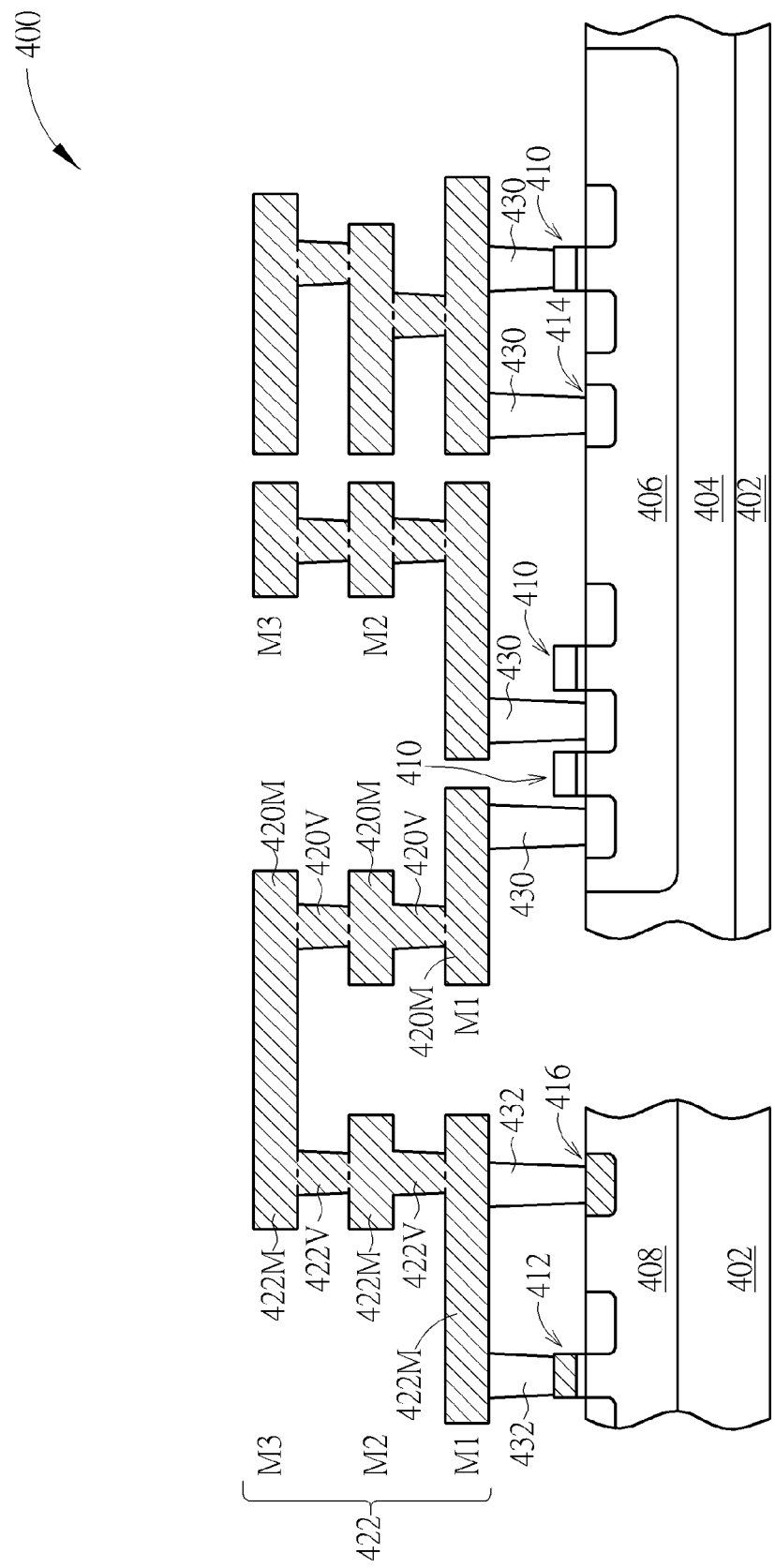
FIG. 5 is a schematic drawing illustrating a semiconductor structure provided by a preferred embodiment of the present invention.

Please refer to FIG. 5, which is a schematic drawing illustrating a semiconductor structure provided by a preferred embodiment of the invention. The semiconductor structure 400 includes a p-substrate 402, and a first p-typed well 406 and a second p-typed well 408 are formed in the p-substrate 402. The first p-typed well 406 and the second p-typed well 408 are physically spaced apart from each other. It is noteworthy that a DNW 404 is formed in the p-substrate 402 in order to prevent noise, and the first p-typed well 406 is formed in and encompassed by the DNW 404. A plurality of first devices 410 are formed in the first p-typed well 406 in the DNW 402 and at least a second device 412 is formed in the second p-typed well 408 in the p-substrate 402. Additionally, at least a diode 414 is formed in the first p-typed well 406 and at least a diode 416 is formed in the second p-typed well 408 according to the preferred embodiment. The diode 414 is electrically connected to the first device 410 and the second diode 416 is electrically connected to the second device 412. However, those skilled in the art would easily realize that the diodes 414 and 416 can be ignored as long as the DNW-correlated antenna rule is complied. The semiconductor structure 400 further includes a plurality of first interconnections 420 electrically connected to the first devices 410 and a plurality of second interconnections 422 electrically connected to the second device 412. Furthermore, the first interconnections 420 are electrically connected to the DNW 404 as shown in FIG. 5. It is noteworthy that the interconnections stacked on the DNW 404 are all recognized as the first interconnections 420. Those skilled in the art would easily realize that the first interconnections 420 are constructed by a plurality of metal layers 420M and a plurality of via plugs 420V, and the second interconnections 422 are constructed by a plurality of metal layers 422M and a plurality of via plugs 422V. Furthermore, the metal layers 420M/422M are formed in a plurality of dielectric layers (not shown) and are also recognized as M1, M2, M3 . . . , and so on. And the via plugs 420V/422V are formed to electrically connect the metal layers 420M/422M. Additionally speaking, a plurality of first contact plugs 430 are provided to electrically connect the first device 410 to the first interconnections 420 and a plurality of second contact plugs 432 are provided to electrically connect the second device 412 to the second interconnections 422. As shown in FIG. 5, in the preferred embodiment, the first interconnections 420 and the second interconnections 422 are electrically connected so that the second device 412 is electrically connected to the DNW 404.

More important, the semiconductor structure 400 provided by the preferred embodiment complies with the DNW-correlated antenna rule, which includes inequality as mentioned above, therefore the semiconductor structure 400 itself is impervious to the DNW charging issue. That is, the charges generated during the fabricating processes will no longer impact the second device 412, and thus the semiconductor structure 400 provided by the preferred embodiment is ensured to have a stable, reliable and qualified electrical performance.

Figure 6:
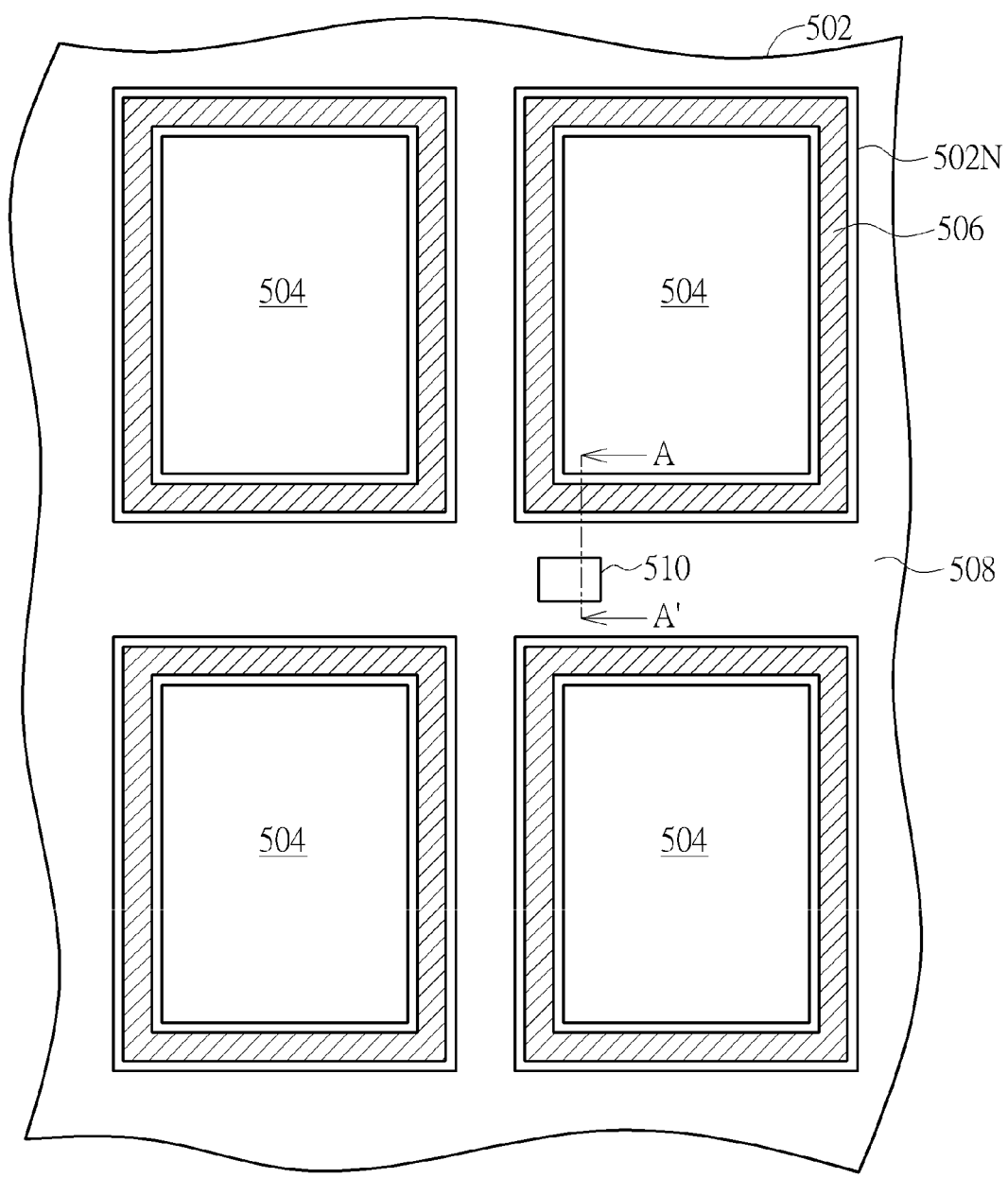
FIG. 6 is a schematic top view of a semiconductor monitoring device provided by a preferred embodiment of the present invention.
Figure 7:
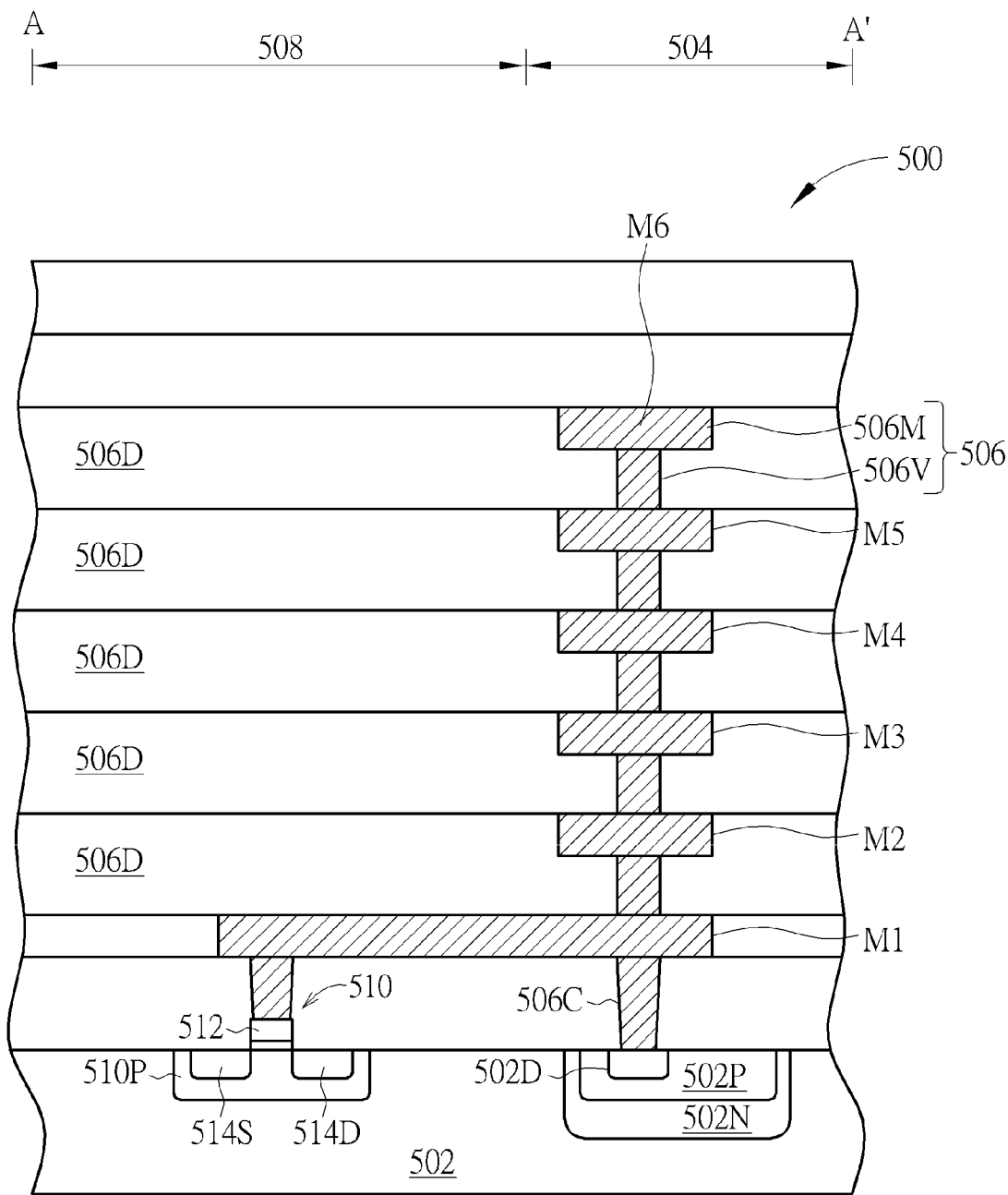
FIG. 7 is a cross-sectional view take along a Line A-A' of FIG. 6.

More than that, a preferred embodiment of the present invention provides a semiconductor monitoring device for monitoring the fabricating process of an integrated circuit. Please refer to FIG. 6 and FIG. 7, FIG. 6 is a schematic top view of the provided semiconductor monitoring device and FIG. 7 is a cross-sectional view take along a Line A-A' of FIG. 6. As shown in FIGS. 6 and 7, a semiconductor monitoring device 500 is provided. The semiconductor monitoring device 500 includes a semiconductor wafer such as a p-substrate 502. It should be noted at first that, as shown in FIG. 6, a plurality of die regions 504 and a scribe line region 508 are defined on the p-substrate 502. Furthermore, a plurality of die seal rings 506 are formed in the die regions 504, respectively. The scribe line region 508 separates the die regions 504, and the die seal rings 506 respectively surround an entire die region 504. The die seal rings 506 are respectively disposed between the die regions 504 and the scribe line region 508, such that the die seal rings 506 serve as a blocking wall for protecting the die regions 502 from external stress while dicing and individualizing each die of the wafer.

Please refer to FIGS. 6 and 7 together. The die seal ring 506 is formed on the substrate 502 and is usually formed simultaneously with the interconnections formation, therefore the die seal ring 506 includes a plurality of metal layers 506M and a plurality of via plugs 506V formed in a plurality of dielectric layers 506D. Furthermore, the metal layers 506M are recognized as M1, M2, M3 . . . and Mn, and the via plugs 506V are formed to electrically connect those metal layers 506M. Additionally, the die seal ring 506 further includes a plurality of contact plugs 506C connecting the metal layers 506M and the via plugs 506V to the p-substrate 502. More important, the semiconductor monitoring device 500 provided by the preferred embodiment further includes a DNW 502N formed in the p-substrate 502, a p-typed well 502P formed in the DNW 502N, and a heavily doped n-region 502D formed in the p-typed well 502P. As shown in FIG. 7, the contact plug 506C is landed on the heavily doped n-region 502D. Accordingly, the die seal ring 506 is electrically connected to the heavily doped n-region 502D, to the p-typed well 502P, and to the DNW 502N. It should be noted that the p-typed well 502P and the heavily doped n-region 502D are optional elements and therefore can be ignored depending on different product requirement. In a modification to the preferred embodiment, the die seal ring 506 can be landed on the p-typed well 502P. In another modification to the preferred embodiment, the die seal ring can be directly landed on the DNW 502N. Furthermore, as shown in FIG. 6, the DNW 502N is formed under the die seal ring 506. In other words, the die seal ring 506 overlaps the DNW 502N, and a width of the DNW 502N is preferably larger than a width of the die seal ring 506.

Please still refer to FIGS. 6 and 7. The semiconductor monitoring device 500 provided by the preferred embodiment further includes a monitoring device 510 formed in the scribe line region 508. More important, the monitoring device 510 is electrically connected to the die seal ring 506 as shown in FIG. 7. In detail, the monitoring device 510 comprises a MOSFET device, the MOSFET device includes a gate electrode 512, a source region 514S and a drain region 514D. And the die seal ring 506 is electrically connected to the gate electrode 512 of the MOSFET device. Additionally, the p-substrate 502 includes a p-typed well 510P, and the monitoring device 510 is formed and located in the p-typed well 510P.

Figure 8:
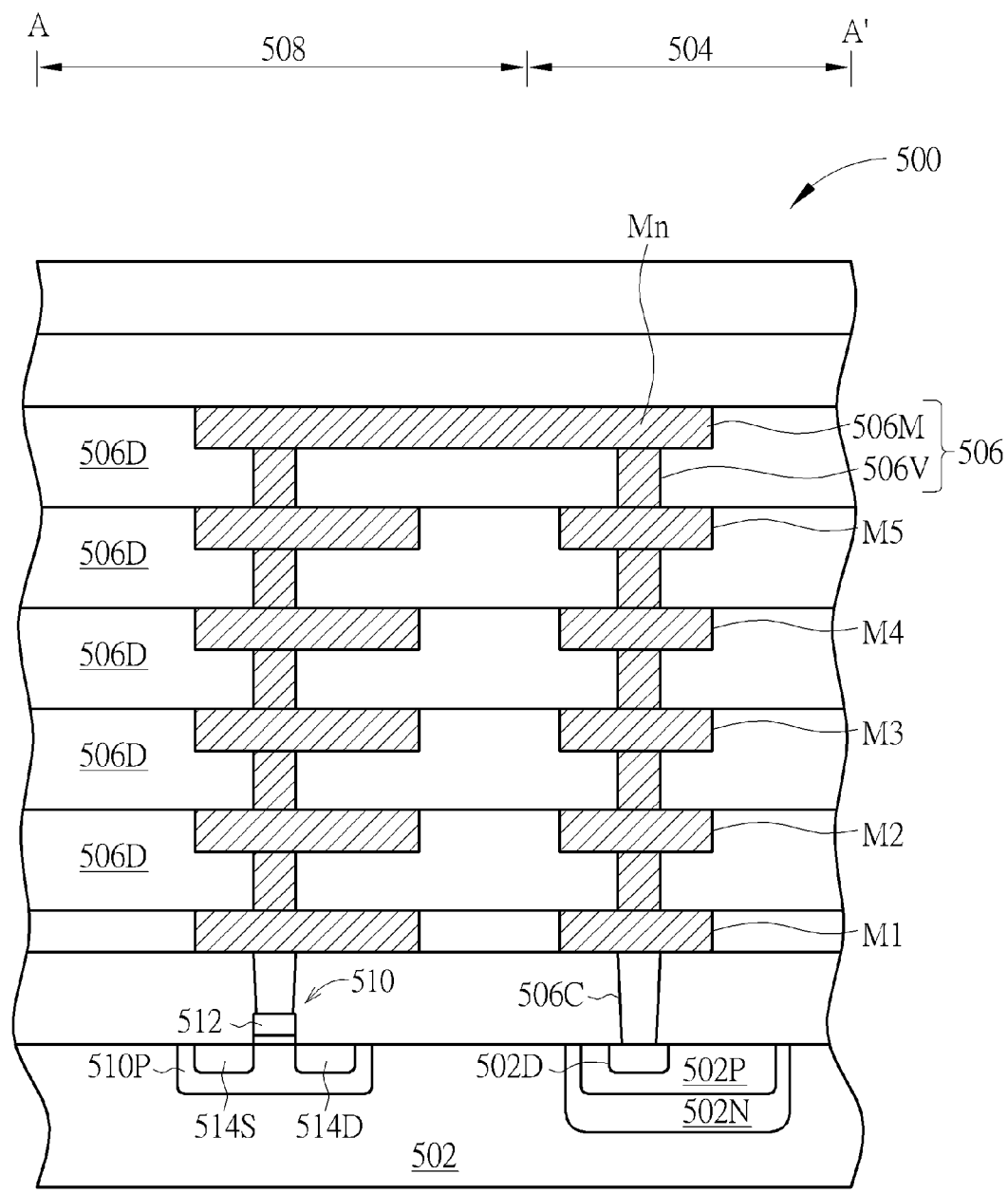
FIG. 8 is a schematic drawing illustrating a semiconductor monitoring device provided by another preferred embodiment of the present invention.

Please refer to FIG. 8, which is a schematic drawing illustrating a semiconductor monitoring device provided by another preferred embodiment of the present invention. It is noteworthy that elements the same in the preferred embodiment and the abovementioned preferred embodiment are designated by the same numerals. It should be noted that though the monitoring device 510 is electrically connected to the die seal ring 506 through the metal layer M1, it is not limited to this. In other words, the monitoring device 510 can be electrically connected to the die seal ring 506 through any metal layer Mn of the interconnections of the die seal ring 506, as shown in FIG. 8.

It has been found that the DNW-correlated antenna effect is related to the area of the DNW. Therefore, the DNW 502N having a large area (larger than an area of the die seal ring 506) is provided to serve as the antenna so that a lot of charges may accumulate in the DNW 502N. And the charges keep on accumulating during the fabricating processes. Furthermore, the accumulated charges are poured and injected to the monitoring device 510 through the interconnections of the die seal ring 506. Once the monitoring device 510 is failed, it can be concluded that the DNW-correlated antenna effect is detected. Since the DNW 502N includes the large area, the antenna effect is amplified. Consequently, the DNW-correlated antenna effect can be easily detected much earlier than it occurs in the important die regions 504. And therefore the important devices formed in the die regions 504 are efficaciously protected from the DNW-correlated antenna effect.

According to the present invention, a method for performing a DNW-correlated antenna rule check of an integrated circuit is provided. The method includes an inequality that must be complied. When the inequality is violated, the design layout of the integrated circuit must be re-designed and/or adjusted. That is, the method for performing the DNW-correlated antenna rule check of the integrated circuit of the present invention provides a practical inequality to guide the layout designer so that the DNW-correlated antenna effect can be efficaciously prevented. Accordingly, a semiconductor structure formed in accordance with the design layout can be obtained, and the semiconductor structure is protected from the DNW-correlated antenna effect. Furthermore, the present invention provides a semiconductor monitoring device. By landing the die seal ring on a large-area DNW, the DNW-correlated antenna effect is amplified and thus is easily detected by the monitoring device, which is electrically connected to the die seal ring.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing a deep n-typed well correlated (DNW-correlated) antenna rule check of an integrated circuit, comprising:

providing a design layout of the integrated circuit to a design rule check (DRC) tool, the design layout of the integrated circuit comprising a deep n-typed well, at least a first device formed in the deep n-typed well, a plurality of first interconnections electrically connected to the first device, at least a second device, a plurality of second interconnections electrically connected to the second device, and at least one or more diode electrically connected to the second device, and the second device being electrically connected to the deep n-typed well;

checking the design layout of the integrated circuit with the DNW-correlated antenna rule by the DRC tool, the DNW-correlated antenna rule comprising an inequality as following:

$$Ma/Ga<(P+200*n)$$

wherein Ma indicates a sum of areas of the first interconnections and areas of the second interconnections, Ga indicates a gate area of the second device, P indicates a first predetermined value, and n indicates a second predetermined value, and the second predetermined value is equal to an area of the diode;

re-designing the layout design of the integrated circuit in the DRC tool when the DNW-correlated antenna rule is violated; and fabricating the integrated circuit from the design layout when the DNW-correlated antenna rule is complied.

2. The method for performing the DNW-correlated antenna rule check of the integrated circuit according to claim 1, wherein the first interconnections and the second interconnections are electrically connected.

3. The method for performing the DNW-correlated antenna rule check of the integrated circuit according to claim 1, further comprising at least a first contact plug electrically connecting the first device to the first interconnections and at least a second contact plug electrically connecting the second device to the second interconnections.

4. The method for performing the DNW-correlated antenna rule check of the integrated circuit according to claim 1, wherein the second device is formed in a p-typed well.

5. The method for performing the DNW-correlated antenna rule check of the integrated circuit according to claim 1, wherein the second device comprises a MOSFET device, the MOSFET device comprises a gate electrode, a source region and a drain region, and the second interconnections are electrically connected to the gate electrode of the MOSFET device.

6. The method for performing the DNW-correlated antenna rule check of the integrated circuit according to claim 1, wherein the first device and the second device comprise a 65 nanometer (65 nm) device size, and the first predetermined value is equal to 800.

7. The method for performing the DNW-correlated antenna rule check of the integrated circuit according to claim 1, wherein the first device and the second device comprise a 40 nm device size, and the first predetermined value is equal to 600.

8. A semiconductor structure comprising:

a substrate comprising a deep n-typed well and a p-typed well formed therein;

at least a first device formed in the deep n-typed well;

a plurality of first interconnections formed on the substrate and electrically connected to the first device;

at least a second device formed in the p-typed well;

at least one or more diode formed in the p-typed well and electrically connected to the second device; and a plurality of second interconnections formed on the substrate and electrically connected to the second device and to the first interconnections, wherein areas of the first interconnections, areas of the second interconnections and a gate area of the second device comply with a DNW-correlated antenna rule, and the DNW-correlated antenna rule comprises an inequality as following:

$$Ma/Ga < (P+200*n)$$

wherein Ma indicates a sum of the areas of the first interconnections and the areas of the second interconnections, Ga indicates the gate area of the second device, P indicates a first predetermined value, and n indicates a second predetermined value, and the second predetermined value is equal to an area of the diode.

9. The semiconductor structure according to claim 8, wherein the first device and the second device comprise a 65 nanometer (65 nm) device size, and the first predetermined value is equal to 800.

10. The semiconductor structure according to claim 8, wherein the first device and the second device comprise a 40 nm device size, and the first predetermined value is equal to 600.

\* \* \* \* \*